GLASS VAPOR DEPOSITION ON SURFACES OF SEMICONDUCTOR ELEMENTS
Filed Nov. 23, 1970
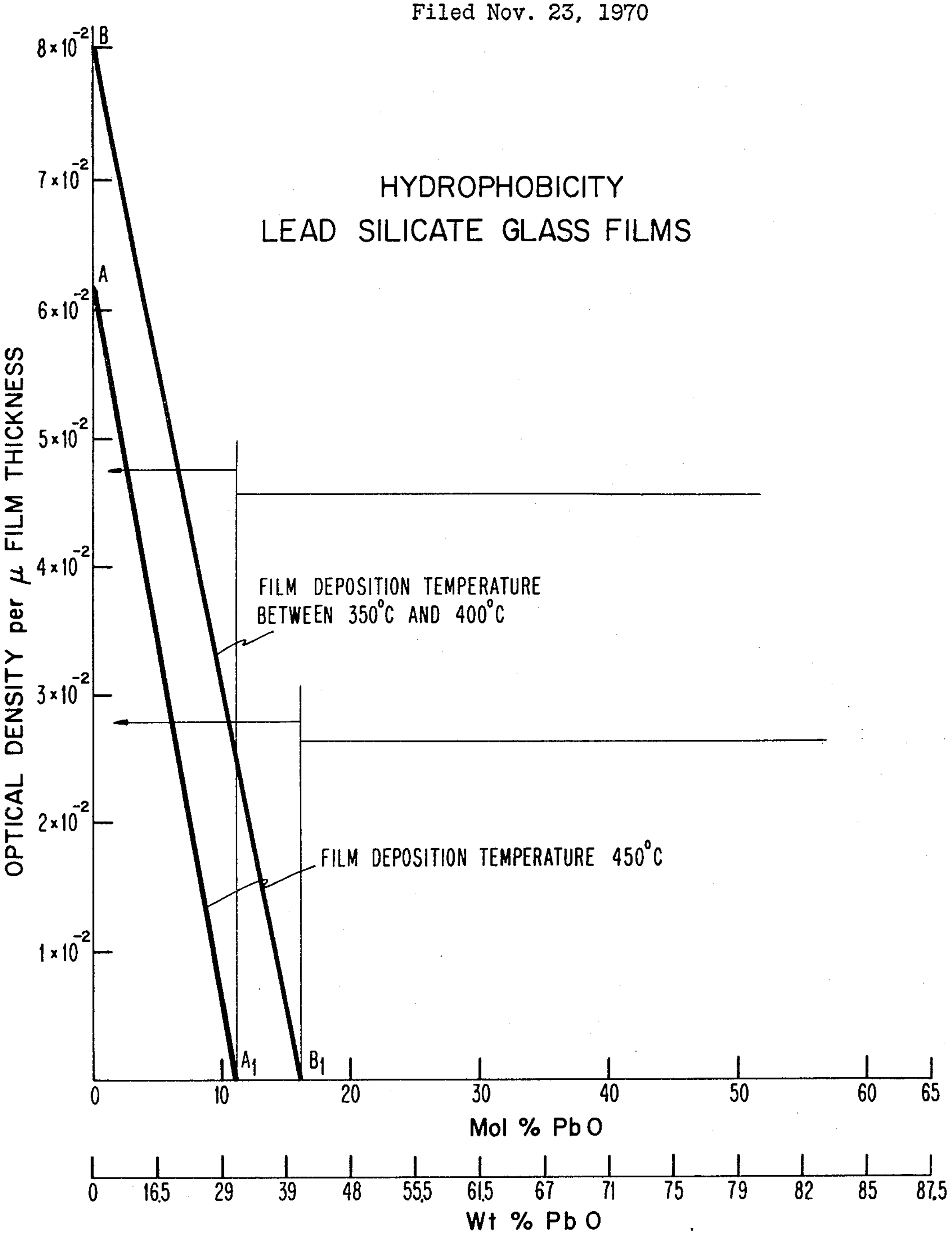
INVENTORS
PEI-CHING LI
PAUL J TSANG
BY [signature]
ATTORNEY United States Patent Office 3,706,597
Patented Dec. 19, 1972

3,706,597

GLASS VAPOR DEPOSITION ON SURFACES OF SEMICONDUCTOR ELEMENTS

Pei-Ching Li, Hopewell Junction, and Paul J. Tsang, Wappingers Falls, N.Y., assignors to International Business Machines Corporation, Armonk, N.Y.

Filed Nov. 23, 1970, Ser. No. 91,639
Int. Cl. C23c *11/08*
U.S. Cl. 117—201 6 Claims

ABSTRACT OF THE DISCLOSURE

A process for vapor deposition of glass films on semiconductor materials which comprises heating the semiconductor material in an atmosphere mixture of organo silicon, organo lead, oxygen and nitrogen.

FIELD OF THE INVENTION

The present invention relates to an improved method for applying glass or glass-like films to surfaces of semiconductor elements and for producing a homogeneous, hydrophobic insulating films. It is well known in the production of semiconductor elements that certain surfaces such as at exposed junction edges require passivation in order to obtain life characteristics consistent with a given design. One method of approaching the passivation of critical surfaces is coating of such surface with a passivating film such as certain plastics, glass and the like. A typical prior art treatment is to pass oxygen into contact with the surface of a silicon wafer or die at a temperature of approximately 800° C. to form a surface film of silicon dioxide ($SiO_2$) and then to remove the silicon dioxide film from some of the surfaces.

It is known that the protection of semiconductor devices may be accomplished by the formation of an inorganic glass coating on the surface of the semiconductor material which covers the exposed portion of each junction in a semiconductor unit. An inorganic glass coating has certain advantages as compared to other protective coatings because it is less pervious to moisture than organic substances which have been used for encapsulation of certain devices. The glass is much less likely to deteriorate with age than organic materials and is less likely to contain ionic substances which contaminate the underlying semiconductor. It is believed that ionic impurities have less mobility in an inorganic glass film than in an organic film. Inorganic glass films provide geometrical stability and controllable etchability so that via holes for terminal connections can be precisely and accurately prepared.

DESCRIPTION OF THE PRIOR ART

It is known to form protective glass coating on silicon semiconductor material by oxidizing the material at its surface. This method has had some serious limitations because it has been found necessary to carry out the oxidation at a relatively high temperature. The silicon material has typically been oxidized at temperatures in the range of from 900° C. to 1100° C. Where a semiconductor unit contains metal or alloy constituents such as aluminum, oxidation and processing temperatures of the above magnitude can be deleterious to metal parts. Likewise, when a semiconductor unit contains doping impurities and is heated to such temperatures for any appreciable time, the doping impurities diffuse within the semiconductor material. When the doping impurities diffuse due to high temperature heating in the oxidation process referred to above, the junctions in the semiconductor unit are displaced thus changing the device parameters and sometimes even making the semiconductor unit unsatisfactory for use in an electronic device.

The production of protective glass film coatings on semiconductors is also accomplished by sputtering. This method requires expensive apparatus and has certain disadvantages namely: radiation exposure, films do not exhibit conformability, and possess excessive pinhole defects. Glass coatings are also produced by pyrolysis of $SiH_4$ or tetra ethyl orthosilicate in order to form $SiO_2$ films. These films are not impermeable to water and lack stability for electronic device application.

Another method for forming glass films is glass powder sedimentation and fusion. This method requires a relatively higher temperature and films exhibit pinhole defects. The sodium contaminant in powdered glass is excessively high for electronic device applications.

Recently the art has broadly taught that by carrying out the oxidation of a silicon semiconductor surface in an atmosphere of lead mono-oxide (PbO), the oxidation reaction is accelerated and the reaction temperature can be decreased, and moreover, a resulting oxide film having excellent high moisture resistance can be obtained.

SUMMARY OF THE INVENTION

In view of the problems and disadvantages of existing methods, namely, the lowering as much as possible of the temperature for the forming of oxide film, the formation of an oxide film with good moisture resistance properties and the reduction of the variations in the characteristics of semiconductor devices due to the oxide film, the present invention contemplates a pyrolytic film deposition method for semiconductor devices which in comparison with the prior art methods requires simpler process steps and avoids the requirement of specialized apparatus or reactor designs and produces performance results which are superior and more economical.

It is an object of this invention to provide a method for producing stable hydrophobic glass films on semiconductor elements.

It is a further object of this invention to produce stable hydrophobic glass films having improved etchability and thermo-compatibility with silicon and metal elements or components integral with the semiconductor element.

It is a further object of this invention to provide a method for the vapor deposition of hydrophobically stable glass films at substantially reduced deposition temperatures.

Accordingly, the principal object of the present invention is in providing for an improved method of applying a glass or glass-like films to surfaces of semiconductor elements for encapsulating or passivating purposes. Other objects and features will be apparent from the following detailed description, examples and drawing.

DESCRIPTION OF THE PREFERRED EMBODIMENTS

Broadly, the process of the present invention involves heating a silicon semiconductor material to a temperature of at least 300° C. in an atmosphere comprising a mixture of organo silicon and organo lead compounds and oxygen in the presence of an inert carrier gas whereby a hydrophobic glass film is pyrolytically vapor deposited on a semiconductor material. Although the broad inventive concept is expressed in terms of a binary silicon oxide-lead oxide ($SiO_2$–PbO) type glass deposition, tertiary and quaternary mixtures embodying the addition of such elements as boron, phosphorus and the like, are contemplated.

Any suitable heating means may be utilized to heat the semiconductor material. Such sources of heat as RF, resistance wire and ultraviolet and combinations thereof may be used. Any suitable apparatus capable of containing and maintaining the desired atmosphere and heating means is suitable for carrying out the described process steps.

Chemically deposited silica films whether prepared from simple silane or tetraethyl orthosilicate generally exhibits undesirable hydrophilic properties which are highly objectionable in microcircuit encapsulation because the moisture absorption by the film in certain instances can adversely deteriorate the device stability. Numerous methods of hydrophobization have been suggested, including the surface treatment with some selected compounds to provide a non-polar surface or overlay of some hydrophobic oxides or nitrides as a protective barrier. These methods are generally ineffective in microcircuit encapsulation as they do not provide a permanent hydrophobization which can survive through a series of device manufacturing steps.

Lead glass, because of the presence of easily polarized lead ions in its surface, is known to have less tendency to absorb moisture as well as outgassing on heating than other types of glass.

Silicon bearing compounds from the simple hydride ($SiH_4$) to organo-silicon compounds which have appreciable vapor pressure at room temperature or compounds which can be evaporated at moderate temperatures without pre-heat decomposition are, for example, tetraethyl orthosilicate, diethylsilane, dimethyldiethoxisilane, diphenyldiethoxysilane, diphenyldimethyloxysilane, methyltrimethoxysilane, tetramethylsilane, triethoxysilane, and tetravinylsilane. In addition to the preferred tetraethyl lead compound, other organo lead compounds including tetrabutyl lead, tetramethyl lead and tetraphenyl lead are applicable and suitable for use in the process described.

In addition to nitrogen, such inert gasses as helium and argon are suitable constituents to act as a carrier gas.

The process is capable of being carried out in any conventional suitable apparatus or reactor body, the design of which conveniently provides for a means of heating semiconductor material such as silicon wafers in a vapor or gaseous atmosphere of the type mentioned above. Conventional heating means, such as resistance wire, RF sources or ultraviolet radiant heating are applicable as well as other obvious means.

In order to produce a hydrophobic stable glass film in accordance with this process, the $SiO_2$–PbO glass should contain at least 11 mole percent of PbO. Similarly, the ratio of oxygen and nitrogen contained in the gas or vapor mixture should be in the magnitude of 60% oxygen to 40% nitrogen, or higher. The process is normally carried out at atmospheric pressure, although increased or reduced pressure conditions are applicable provided appropriate apparatus and process conditions are provided for, depending upon the pressure and vacuum conditions desired.

The overall general chemical reaction can be and is illustrated by the following equation:

$$X(C_2H_5)_4Pb+YSi(OC_2H_5)_4+ZO_2\rightarrow A(PbO)_x(SiO_2)_y +BC_2H_6+CC_2H_4+DCO+ECO_2+\text{etc.}$$

It will be apparent where the semiconductor material is heated the vapor or gaseous atmosphere mixture is provided by intermixing the liquid or vapor of organo silicon lead compounds or similar lead and silicon compounds which do not react upon mixing at room temperature or before injection into the reactor chamber but upon exposure to the heated semiconductor material pyrolytically deposit a glass film in accordance with the above equation.

Lead silicates can be chemically vapor deposited in either atmospheric or reduced pressure as indicated above. When the deposition is accomplished in an atmospheric pressure environment a pump or similar apparatus device is not required for removing gaseous reaction products. This is conveniently accomplished by a continuous reaction zone gaseous sweep under a positive pressure slightly higher than atmospheric. The best deposition results are obtained when the partial pressure of the active reactants such as tetraethyl lead and tetraethyl orthosilicate are maintained at a few millimeters of mercury pressure. If it is desirable that the deposition carried out in a reduced pressure system for example, in the neighborhood of a few millimeters of mercury, the reactants can be directly introduced into the reactor zone under their own vapor pressures and the oxygen needed to carry out the reaction fed into the reactor separately without the use of an inert carrier gas.

The chemical vapor deposition of binary lead silicates in accordance with this method contemplates moderate amounts of dopants of the third or fourth metal oxides which can be incorporated in the deposited film without changing the desired hydrophobic properties. However, the etching rate, thermal expansion, electrical properties, etc. may be somewhat modified to some extent by the addition of other metal dopants. Suitable organic compounds of aluminum, zinc, tin, cadmium, titanium, phosphorus, barium, arsenic, antimony, zirconium, tungsten, and the like, are sources of materials for such minor additions. The film deposition temperature for lead silicates with or without dopants of suitable oxides is between 300° to 800° C. or higher, depending on the lead content of the film. With lead oxide content of the film greater than 40 mol percent, the upper limit of the deposition temperature should be about 700° C. For lower lead oxide content film, this upper limit temperature may be slightly increased to 800° C. For microcircuit encapsulation and passivation purposes, the desirable deposition temperature is optimized by the deposition rate while avoiding interaction of metal and for example, aluminum or aluminum copper metallurgy commonly used in microcircuit structures, which tend to deteriorate at temperatures of approximately 500° C. In such cases the deposition temperature should be kept below 500° C.

Films between 10,000 and 30,000 A. in thickness were deposited in accordance with the process described. These films exhibited hydrophobic stability against 85% relative humidity at 85° C. temperature for a five day exposure. The infrared characteristic absorption bands for OH and $H_2O$ were measured before and after the above relative humidity exposure test. The films deposited at deposition temperatures between 300° C. and 450° C. did not show any OH or $H_2O$ infrared absorption bands.

Hydrophobic lead silicate films formed in accordance with this process had a Refractive Index of at least 1.55 and 11 mol percent PbO where the deposition temperature is 450° C. The PbO content of the hydrophobic film increases directly proportional with the increase of the Refractive Index in accordance with the following table.

| Refractive index: | PbO mol percent |
|---|---|
| 1.49 | 5 |
| 1.54 | 10 |
| 1.59 | 15 |
| 1.63 | 20 |
| 1.67 | 25 |
| 1.71 | 30 |
| 1.76 | 35 |
| 1.81 | 40 |
| 1.92 | 50 |
| 2.09 | 60 |

Similarly, where a lead silicate film is deposited in accordance with this method at 400° C. or 350° C., the PbO content should be at least 16 mol percent.

The hydrophobic and hydrophilic nature of lead silicate glass films produced by this method at various deposition temperatures is further explained and illustrated in the accompanying drawing which shows (SC) the hydrophobic character of lead silicate films at various lead oxide concentrations as measured by optical density after exposure for five days in an atmosphere of 85% relative humidity and 85° C.

The following examples are illustrative of specific embodiments of this invention and are not intended in any way whatsoever to limit the scope of the concept.

Any apparatus comprising an ordinary barrel type reactor chamber having a means for holding and heating silicon semiconductor wafers, and an inlet gas means for maintaining a predetermined atmosphere within said chamber and a means for mixing a gas was used to carry out the process.

At atmospheric pressure an oxygen supply was passed through a suitable measuring means into the gas mixing chamber where the oxygen was intermixed with a flow of nitrogen which was bubbled through a 100% solution of tetraethyl lead and a flow of oxygen which was passed through a volume of the tetraethyl orthosilicate. The gas mixture outgas from the gas mixing station comprised $O_2$ and $N_2$ carry vaporized tetraethyl lead and tetraethyl orthosilicate which were entrained with the $N_2$ and $O_2$ by the vapor pressure of each compound at room temperature. This gas was passed into the reaction chamber containing heated silicon wafer under conditions shown in the following tabularized examples where $O_2$/TEOS is liters per minute flow through tetraethyl orthosilicate and $N_2$/TEL is liters per minute $N_2$ through tetraethyl lead $N_e$ is the Refractive Index of the film measured at a wave length of 5461 A. TA. is the thickness of the film deposited. H is $H_2O$ absorption ($0.1\times 10^{-2}$) in optical density per micron film thickness after five days exposure to an air atmosphere at 85° C. and 85% humidity. (Table I)

ing of alkyl lead compounds of from 1–4 carbon atoms, inert gas and organo ortho silicon selected from the group consisting of silicon oxygen alkyl compounds having from 1–4 carbon atoms.

2. A method of claim 1 where the semiconductor material is silicon.

3. A method of claim 1 where the organo lead is tetraethyl lead and the organo silicon is tetraethyl orthosilicate.

4. A method for pyrolytic deposition of hydrophobic glass films on semiconductor materials which comprises heating the semiconductor material between 300° C. and 800° C. in an atmosphere comprising a mixture of organo lead selected from the group consisting of alkyl lead compounds of from 1–4 carbon atoms, inert gas, organo silicon selected from the group consisting of alkyl silicon compounds of from 1–4 carbon atoms and organo boron selected from the group consisting of alkyl boron compounds of from 1–4 carbon atoms.

5. A method for pyrolytic deposition of hydrophobic glass films on semiconductor material which comprises heating the semiconductor material between 300° C. and 800° C. in an atmosphere comprising a mixture of organo lead selected from the group consisting of alkyl lead compounds of from 1–4 carbon atoms, organo silicon selected from the group consisting of alkyl silicon compounds of from 1–4 carbon atoms, organo phosphorus selected from the group consisting of alkyl phosphorus compounds of from 1–4 carbon atoms, and an inert gas.

6. A method for pyrolytic deposition of hydrophobic glass films on semiconductor materials which comprises heating the semiconductor material between 300° C. and 800° C. in an atmosphere comprising a mixture of organo lead selected from the group consisting of alkyl lead compounds of from 1–4 carbon atoms, organo silicon selected from the group consisting of alkyl silicon compounds of from 1–4 carbon atoms, organo phosphorus selected from the group consisting of alkyl phosphorus compounds of from 1–4 carbon atoms, organo boron selected from the group consisting of alkyl boron compounds of from 1–4 carbon atoms and an inert gas.

TABLE I

| Example | $O_2$/ MAIN | $O_2$/ TEOS | $N_2$/ TEL | Deposition temperature, ° C. | $N_e$ | tA. | Deposition time, minutes | H |
|---|---|---|---|---|---|---|---|---|
| 1 | 2 | 3 | 2 | 400 | 1,593 | 9,615 | 80 | 0.43 |
| 2 | 2 | 2 | 2 | 450 | 1.604 | 9,369 | 60 | 0 |
| 3 | 2 | 0.5 | 2.5 | 450 | 1.779 | 6,398 | 120 | 0 |
| 4 | 2 | 0.5 | 2.5 | 400 | 1.741 | 6,800 | 75 | 0 |
| 5 | 2 | 3 | 2 | 450 | 1.512 | 4,500 | 18 | 0 |
| 6 | 7 | 0.5 | 3.5 | 350 | 1.693 | 1,251 | 35 | 0 |
| 7 | 7 | 1.5 | 3.5 | 400 | 1.655 | 10,631 | 90 | 0 |
| 8 | 5.5 | 3 | 3.5 | 350 | 1.633 | 6,490 | 120 | 1.14 |
| 9 | 7 | 1.5 | 3.5 | 350 | 1.685 | 10,497 | 175 | 0 |
| 10 | 0.5 | 3 | 3.5 | 350 | 1.650 | 6,445 | 70 | 0 |
| 11 | 1 | 2.5 | 3.5 | 400 | 1.664 | 9,019 | 60 | 0 |
| 12 | 1 | 2.5 | 3.5 | 350 | 1.650 | 8,367 | 90 | 0 |

The electrical properties of a typical film illustrated in the above examples are illustrated by Example No. 3 where PbO content of the film is 38.5 mol percent, and the dielectric content is 8.0.

The following Table II illustrates process conditions for the addition of boron and phosphorus to binary lead silicates to produce a hydrophobic glass film in accordance with the disclosed method, where gas feed is also in liters per minute flow and TMB is tetramethylborate and TEP tetraethylphosphite.

TABLE II

| Example | $O_2$/MAIN | $O_2$/TEOS | $N_2$/TEL | $N_2$/TMB | $O_2$/TEP | Temp.,° C. | $N_e$ | tA. | H |
|---|---|---|---|---|---|---|---|---|---|
| 1 | | 1.16 | 1.16 | 0.033 | 0.033 | 450 | 1.652 | 9,350 | 0 |
| 2 | | 3 | 3 | 0 | 0.25 | 450 | 1.507 | 10,065 | 0 |
| 3 | | 3 | 3 | 0 | 0.25 | 400 | 1.647 | 9,344 | 0 |

While the invention has been particularly shown and described with reference to a preferred embodiment thereof, it will be understood by those skilled in the art that the foregoing and other changes in form and detail and omissions may be made therein without departing from the spirit and scope of the invention.

What is claimed is:

1. A method for pyrolytic vapor deposition of hydrophobic glass films on semiconductor materials which comprises heating the semiconductor material between 300° C. and 450° C. in an atmosphere comprising a mixture of organo lead selected from the group consist-

References Cited

UNITED STATES PATENTS

| | | | |
|---|---|---|---|
| 3,481,781 | 12/1969 | Kern | 117—201 |
| 3,410,736 | 11/1968 | Tokuyama | 117—201 X |
| 3,447,958 | 6/1969 | Okutsu | 117—201 |

RALPH S. KENDALL, Primary Examiner

U.S. Cl. X.R.

117—213, 106 A